United States Patent [19]

Kelly

[11] Patent Number: 6,063,999
[45] Date of Patent: May 16, 2000

[54] SURFACE MOUNT SPRING GASKET AND EMI ENCLOSURE

[75] Inventor: Clifford Mark Kelly, Windham, N.H.

[73] Assignee: Siemens Medical Systems, Inc., Iselin, N.J.

[21] Appl. No.: 08/994,635

[22] Filed: Dec. 19, 1997

[51] Int. Cl.[7] ................................................ H05K 9/00
[52] U.S. Cl. .................... 174/35 R; 361/816; 361/818; 361/799; 361/800; 361/753
[58] Field of Search ............................ 174/35 R, 35 GC, 174/51; 361/816, 818, 799, 800, 753

[56] References Cited

U.S. PATENT DOCUMENTS

| 2,580,321 | 12/1951 | Rees | 173/324 |
| 3,277,230 | 10/1966 | Stickney et al. | 174/35 |
| 4,554,400 | 11/1985 | Schmalzl | 174/35 |
| 4,661,888 | 4/1987 | Jewell et al. | 361/424 |
| 4,780,570 | 10/1988 | Chuck | 173/35 GC |
| 5,313,016 | 5/1994 | Brusati et al. | 174/35 |
| 5,418,685 | 5/1995 | Hussmann et al. | 361/719 |
| 5,825,634 | 10/1998 | Moorehead, Jr. | 361/816 |

FOREIGN PATENT DOCUMENTS 406090093   3/1994   Japan ................................... 174/35 R Primary Examiner—William A. Cuchlinski, Jr.
Assistant Examiner—Ronnie Mancho
Attorney, Agent, or Firm—Lawrence C. Edelman

[57] ABSTRACT

A method and apparatus for creating an electrically conductive path between ground conductors on a printed circuit board (PCB) and downwardly facing walls of an electromagnetic interference (EMI) housing, uses surface mountable conductive spring-like strips. A plurality of surface mount device receiving areas are provided at predetermined spaced positions along the ground conductors on the PCB, and a pick and place device is used for automatically positioning a plurality of the conductive spring-like strips at each of the surface mount device receiving areas, each strip having at least one upwardly facing engagement portion. Thereafter, the conductive spring-like strips are affixed on the PCB by, for example, wavesolder techniques. The engagement portion is adapted to engage and make electrically conductive contact with an abutting portion of an EMI housing during fastening of the EMI housing to the PCB.

11 Claims, 2 Drawing Sheets

SURFACE MOUNT SPRING GASKET AND EMI ENCLOSURE

BACKGROUND OF THE INVENTION

1. Field of the Invention

The present invention relates generally to the field of electromagnetic shielding, and in particular, to a surface mount spring gasket to assist electrical connectivity between components that must be joined to provide electromagnetic shielding.

2. Description of the Background Art

Electromagnetic interference (EMI) is a common problem faced during the operation of electronic equipment. EMI is unwanted electromagnetic energy entering or emitting from a specific piece of electronic equipment, thereby causing interference. EMI can cause that piece of electronic equipment or electronic equipment nearby to function improperly or to not function at all.

Typically, electronic equipment is housed within metallic cabinets to help reduce EMI problems. In order to reduce cost and weight, for example, some cabinets are made out of non-conductive plastic, thereby establishing the need for smaller EMI housings. Additionally, it is know that small EMI housings are sometimes required to shield electrical components mounted on a printed circuit board (PCB) from EMI caused by other electrical components also mounted on the PCB. EMI housings for PCBs generally comprise a planar sheet metal structure having a top and at least four downward facing walls which are mounted on a PCB so as to enclose therein the electronic components for which EMI shielding is required. Unfortunately, the labor involved in the fabrication, assembly and connection of such planar sheet metal parts to form the EMI housing and its connection with the PCB is significant, thereby causing a relatively high cost for the EMI shielding portion of the electronic equipment. It is known, for example from U.S. Pat. No. 5,418,685 issued May 23, 1995, to provide a housing that is comprised of two halves, an upper and lower half, each designed to be positioned on opposing sides of a PCB and for being joined together so as to form an EMI housing including internal walls for various portions of the PCB. Unfortunately, unless the housing halves are manufactured with extreme precision, their flatness tolerance at the wall portions where they join with the PCB are generally insufficient to make an electrical contact which is sufficient for providing acceptable EMI shielding. Although it is well known to provide various types of gaskets as "fillers" between the PCB contact areas (such as ground plane conductor paths) and the downward facing walls of the EMI housing halves, current gaskets are somewhat unacceptable. The reasons for their unacceptability generally flow from the fact that the housing halves include several internal walls that need to make good contact with the PCB. The walls includes gaps in it where conductors and conductor paths enter and exit from the PCB. These gaps and internal walls add substantial difficulty to finding an acceptable gasket since some wall segments are as small as 0.3 inches long and the ground plane conductor on the PCB are typically only 0.1 inches wide. The use of commercially available gaskets, such as the widely used metal strip commonly referred to as "finger stock", is inappropriate due to its relatively large size compared with the small sized conductors and housing walls of such small size. Intensive labor actions are involved for cutting, fitting and installing such gaskets on conductors and housing walls of such small size. Alternatively, various conductive elastomer compounds can be used, but again the addition of conductive elastomers adds significant expense to the assembly of the product. An added requirement is that it is often required that the PCB be repaired or serviced and therefore the gasket must be reusable.

In view of the foregoing, it is seen that it would be desirable to provide a spring gasket for use in joining a PCB with an EMI enclosure that is particularly well suited for EMI housings having small walls and/or walls with small openings. Furthermore, the new spring gasket should be reusable and more economical.

SUMMARY OF THE INVENTION

The present invention provides a substantially planar spring strip adapted for being deposited as a surface mount device on an EMI reference conductor of a PCB with a pick and place machine. The spring strip is substantially planar, and includes at least one engaging portion which projects from the plane of the strip, the engaging portion making electrical contact with an EMI housing upon attachment of the EMI housing to the PCB.

DESCRIPTION OF THE PREFERRED EMBODIMENT

Figure 1:
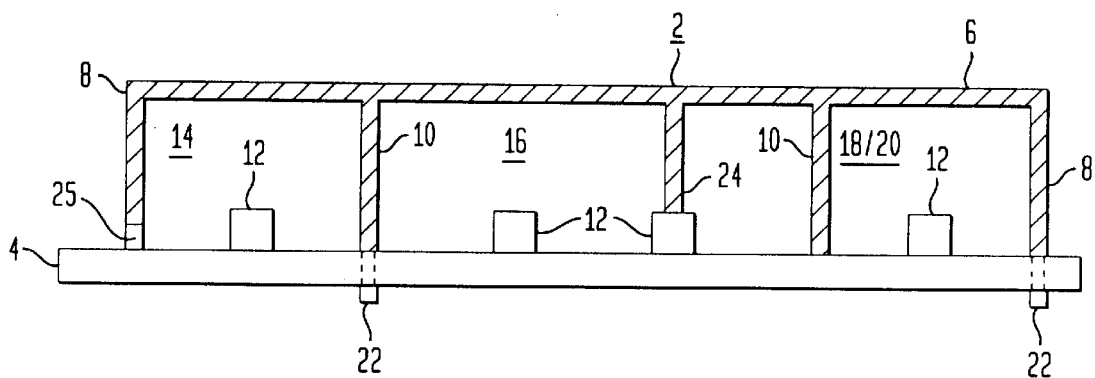
FIG. 1 illustrates a section view of an EMI housing mounted on a PCB.

FIG. 1 illustrates a section view through an EMI housing 2 and a PCB 4. Housing 2 includes a top portion 6, outer wall portions 8, and interior wall portions 10. PCB 4 includes a plurality of electronic components 12 mounted thereon, including certain groups of components 12 which must be isolated for EMI purposes. More specifically, the walls 8 and 10 cooperate so as to form interior EMI enclosures 14, 16 and 18/20, when housing 2 is secured to PCB 4. Such securing can be accomplished using any one of a variety of conventional techniques, for example, using screws 22. Housing 2 may be formed by planar sheet metal parts, joined to one another using conventional techniques to form EMI housing 2. Alternatively, housing 2 may comprise a unitary casting of electrically conductive material, such as aluminum. In some applications a casting may be a preferred low cost technique for forming housing 2, since it may also function as a heat sink for selected ones of components 12 by means of a thermally conductive post 24 integrally formed in housing 2 during the casting process, which post makes thermal contact with the selected component 12 when housing 2 is mounted on PCB 4. Note, it is often required that the interior and exterior walls 8 and 10 of housing 2 occasionally are required to have gaps, such as illustrated by gap 25 in wall 8, in order that signal carrying connectors and conductors can pass along the surface of PCB 4 into and out of the EMI enclosures 14, 16 and 18/20.

Figure 2:
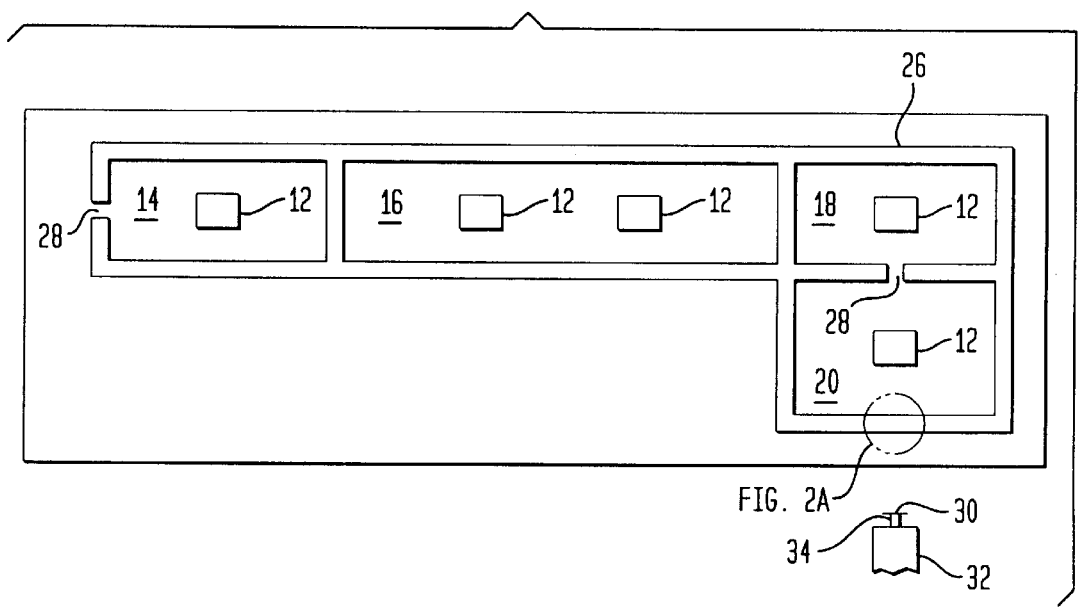
FIG. 2 illustrates a top view of the PCB of FIG. 1.
Figure 2A:
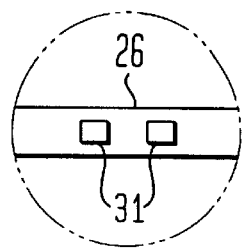

FIG. 2 illustrates ground plane conductor paths 26 which are formed on PCB 4 using conventional techniques so as to be aligned with the wall portions of housing 2, and for making electrical contact therewith and forming EMI enclosures 14, 16 and 18/20. Although paths 26 are referred to as "ground plane" paths, it should be understood that this term is meant to cover applications where paths 26 are not necessarily at ground potential, and for purposes of the present invention, an electrical connection by housing 2 to any reference potential path 26 on PCB 4 which is sufficient for establishing EMI protection, would be acceptable. Note, paths 26 occasionally include gaps 28 that are aligned with gaps 25 formed in housing 2, so as to facilitate the undisturbed passage of signal paths (not specifically shown) into and out of EMI enclosures 14, 16 and 18/20.

The present invention is directed to providing an effective electrical contact between housing 2 and the conductor paths 26 of PCB 4. It is noted that the conductor paths 26 are relatively small, such as only 0.1 inches wide, while the thickness of walls 8 and 10 of housing 2 are approximately 0.08 inches wide. Additionally, gaps 28 are provided in conductor paths 26 in order to allow for the forenoted connectors and signal paths into and out of the EMI enclosures 14, 16 and 18/20. Furthermore, it is noted that when relatively inexpensive parts are used to fashion housing 2, the relatively tight flatness specification for its portions that interface with the conductor paths 26 of the PCB (required in order to make good contact with conductor paths 26) undesirably increases the cost of housing 2 significantly. Use of conventional so-called "finger stock" is generally unacceptable in view of the very narrow width, turns and gaps in of conductor paths 26. Furthermore, use of an electrically conductive compound and/or elastomer along conductor paths 26 in order to ensure a tight fit between the conductor paths 26 and housing 2, is also generally unacceptable, since the process of installing such compounds and elastomers is relatively expensive and/or labor intensive.

Figure 3:
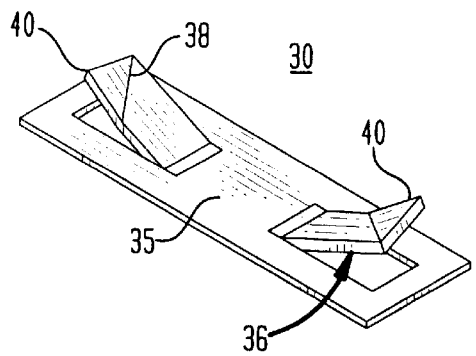
FIG. 3 illustrates an isometric view of a surface mount spring gasket constructed in accordance with the principles of the present invention for electrically connecting the EMI housing with the PCB shown in FIG. 1.

In accordance with the principles of the present invention, a surface mount spring gasket 30, shown in FIGS. 3 and 4, is provided. Spring gasket 30 comprises a substantially planar rectangular piece of electrically conductive material, such at gold plated beryllium copper, dimensioned for being surface mounted along conductor paths 26 using a conventional pick and place surface mount machine. Pick and place surface mount machine 32, functionally illustrated in FIG. 2, places springs 30 on line 26 at corresponding surface mount pad pairs 31, as is conventional for surface mountable devices. Pick and place machine 32 includes a vacuum operated nozzle 34, as well known to those of ordinary skill in this technology, for sequentially picking up spring gaskets 30 and depositing them at predetermined pad positions along conductor paths 26, in accordance with a predefined placement regime that is specified by the designer for ensuring appropriate EMI specifications for each of enclosures 14, 16 and 18/20. For example, springs 30 can be placed along conductor paths 26 at the rate of one each ¾ of an inch, or where EMI requirements are more rigorous, they can be placed practically adjacent one another.

Figure 5:
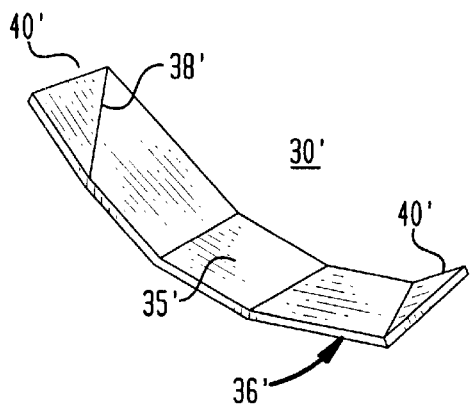
FIG. 5 illustrates an isometric view of a surface mount spring gasket constructed in accordance with an alternative embodiment of the present invention for electrically connecting the EMI housing with the PCB shown in FIG. 1.
Figure 6A:
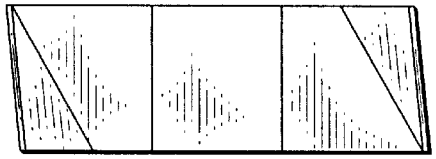
FIGS. 6a, 6b and 6c illustrate top, side and end views of the alternative embodiment spring gasket of FIG. 5.
Figure 6B:
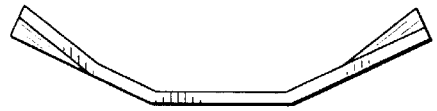
Figure 6C:

As also shown in FIG. 3, spring 30 includes at least one, and in the preferred embodiment two, tab or tang portions 36 that project up from the plane of spring 30, which are responsible for imparting the "spring" function to springs 30. Tangs 36 may be formed by making a "cut-out" from the body of spring 30, as shown in FIGS. 3 and 4, or, in an alternative embodiment (shown by FIGS. 5 and 6, corresponding to a slightly modified version of FIGS. 3 and 4), may simply comprise a raised corner at opposed ends of spring 30. The reference numbers shown in FIG. 5 are shown primed, since they correspond to a slightly modified version of similarly numbered elements already described in FIG. 3. In use, tangs 36 are the first to engage, and in fact "dig in" to the downwardly faced ends of housing 2 when the housing is mounted on PCB 4. This digging in spring action facilitates a good electrical connection between ground paths 26 and its contact points to EMI housing 2. In the preferred embodiment spring 30 is constructed so as to be physically symmetric. Such symmetry results in a spring 30 that is balanced at its midpoint 35, and can therefor be reliably lifted and placed by the pick and place machine 32 by application of the vacuum suction nozzle 34 to its center point 35. Additionally, it is noted that tangs 36 include a diagonal bend 38 therein, formed by an extra step during their manufacture to form a uplifted point 40 at the top of each tang 36 for ensuring a good electrical contact to housing 2.

For use of springs 30, the conductor paths 26 are processed using a silk screen process, as well known to those of ordinary skill in this technology, so as to form solder paste surface mount footprints at all positions where it is desirable to position springs 30. Next, pick and place machine 32 will automatically position springs 30 onto PCB 4 along with electrical components 12 that are also of the surface mount type. Then, the electrical components and spring 30 are fixed in place using, for example, conventional solder reflow equipment. Thereafter, the walls of housing 2 are aligned with conductor paths 26 and affixed to the PCB using conventional techniques, as exemplified by screws 22.

Figure 4A:
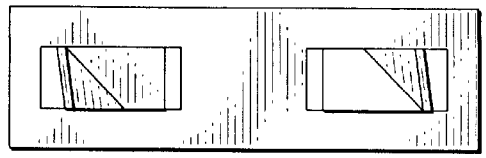
FIGS. 4a, 4b and 4c illustrate top, side and end views of the spring gasket of FIG. 3.
Figure 4B:
Figure 4C:

FIGS. 4a, 4b and 4c illustrate the dimensional details of spring 30 of a typical application.

With the present invention, costly hand application of elastomers, conductive compounds, or other types of mechanical springs along the possibly tortious path of conductor paths 26 are avoided, thereby greatly reducing the cost of providing an EMI gasket between an EMI housing and a PCB. The present invention not only provides for the automatic precise positioning of an EMI spring, but also provides an EMI spring which is reusable, thereby allowing the EMI housing to be removed if required for servicing or other reasons, and then reassembled on the PCB.

In the illustrated preferred embodiment, an aluminum EMI housing 2 is constructed using a low cost casting technique. The resulting casting has a flatness on the ends of the walls which must mate with conductor paths 26, that have a tolerance of ±0.01 inches. The flatness tolerance of conductor paths 26 on the PCB may also be approximately ±0.05, which additively combines with the housing tolerance so as to provide a total flatness variability of ±0.015. As illustrated by FIGS. 3 and 4, the tangs 36 of spring 30 provides a maximum spring compliance of about 0.047 inches, and therefore is sufficient for allowing the use of lower cost EMI housings having a broader range of flatness tolerance.

Thus, a novel spring for providing a precision low cost gasket between a PCB and an EMI housing has been shown. Many alterations and modifications will become apparent to those of ordinary skill in this art after having read the foregoing description. It is to be understood that the illustrated embodiment is merely exemplary, and is not intended to limit the scope of the following claims. For example, although springs 30 are advantageously fixed to paths 26 using wavesoldering techniques, other types of conductive attaching techniques, such as epoxy bonding, could be used. Additionally, springs 30 and tangs 36 could have a shape other than the illustrated rectangular shape and could vary from the embodiment illustrated in the Figures by the manner in which tangs 36 project from the plane of the springs and by the number of tangs formed in each spring. Finally, although the illustrated spring has been designed to be symmetrical, in some applications this may not be required. All such variations are intended to be within the scope of the following claims.

What is claimed is:

1. An apparatus for creating an electrically conductive path between ground conductors on a PCB and a conductive housing adapted to be electrically connected thereto during a fastening operation, the apparatus comprising:

an elongated strip of spring-like conductive material having a periphery dimensioned so as to be electrically connected to ground conductors, on a surface of a PCB using standard surface mount techniques, the strip comprising engaging portions symmetrically disposed in an opposed manner about a planar central area of the strip, the engaging portions adapted to engage an abutting portion of a conductive housing which is adapted to overlay and contact the surface of the PCB along the path of the ground conductors thereon during a fastening operation of the housing to the PCB, each of the engaging portions being formed by a rectangular cut-out internal to the periphery of the strip, the cut-out having a proximate end adjacent to and planar with a planar central area of the strip and a distal end raised from the planar central area of the strip, and wherein a corner portion of the raised distal end of the cut-out has an upward bend formed therein so as to form a raised point which serves to prick the overlaying abutting portion of the housing during the fastening operation of the housing to the PCB.

2. The apparatus of claim 1, wherein the strip is symmetrically formed so that the planar central area comprises a centrally located balance point for the strip.

3. The apparatus of claim 1, wherein diagonally opposed corners of the opposed engaging portions have the upward bend formed therein, so as to form the raised points on diagonally opposed portions of the strip.

4. The apparatus of claim 1, wherein the raised points are a height above the plane of the strip which is approximately the same as the distance between the distal and proximate ends of the cut-out.

5. The apparatus of claim 3, wherein the planar central area of the strip has a length with is approximately the same as the distance between the distal and proximate ends of the cut-out.

6. An apparatus for creating an electrically conductive path between ground conductors on a PCB and a conductive housing adapted to be electrically connected thereto during a fastening operation, the apparatus comprising:

an elongated strip of spring-like conductive material having a periphery dimensioned so as to be electrically connected to ground conductors on a surface of a PCB using standard surface mount techniques, the strip comprising engaging portions symmetrically disposed in an opposed manner about a planar central area of the strip, the engaging portions adapted to engage an abutting portion of a conductive housing which is adapted to overlay and contact the surface of the PCB along the path of the ground conductors thereon during a fastening operation of the housing to the PCB, each of the engaging portions having a proximate end adjacent to and planar with a planar central area of the strip and a distal end raised from the planar central area of the strip, and wherein a corner portion of the raised distal end has an upward bend formed therein so as to form a raised point which serves to prick the abutting portion of the housing during the fastening operation of the housing to the PCB.

7. The apparatus of claim 6, wherein the strip is symmetrically formed so that the planar central area comprises a centrally located balance point for the strip.

8. The apparatus of claim 6, wherein diagonally opposed corners of the opposed engaging portions have the upward bend formed therein, so as to form the raised points on diagonally opposed portions of the strip.

9. The apparatus of claim 6, wherein the raised points are a height above the plane of the strip which is approximately the same as the distance between the distal and proximate ends of the engaging portions.

10. The apparatus of claim 6, wherein the planar central area of the strip has a length with is approximately the same as the distance between the distal and proximate ends of the engaging portions.

11. The apparatus of claim 6, wherein each of the engaging portions are formed by a rectangular cut-out internal to the periphery of the strip.

* * * * *